(12) United States Patent
Hirota

(10) Patent No.: US 8,624,683 B2
(45) Date of Patent: Jan. 7, 2014

(54) SEMICONDUCTOR DEVICE

(75) Inventor: Takanori Hirota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 56 days.

(21) Appl. No.: 13/105,369

(22) Filed: May 11, 2011

(65) Prior Publication Data

US 2011/0279186 A1    Nov. 17, 2011

(30) Foreign Application Priority Data

May 14, 2010  (JP) ................................. 2010-112012

(51) Int. Cl.
*H03B 5/12* (2006.01)
*H03B 5/18* (2006.01)

(52) U.S. Cl.
USPC ................. 331/117 FE; 331/117 R; 331/167; 331/108 C; 331/108 D

(58) Field of Classification Search
USPC ......... 331/117 R, 117 FE, 167, 108 C, 108 D
See application file for complete search history.

(56) References Cited

U.S. PATENT DOCUMENTS

| | | | | |
|---|---|---|---|---|
| 5,952,893 | A * | 9/1999 | Ghoshal ..................... | 331/108 C |
| 6,720,835 | B2 * | 4/2004 | Fujita ........................ | 331/117 R |
| 6,879,234 | B2 * | 4/2005 | Furumiya et al. ............. | 336/200 |
| 2004/0066241 | A1 * | 4/2004 | Gierkink et al. ................ | 331/46 |
| 2005/0156681 | A1 * | 7/2005 | Takinami et al. ......... | 331/117 R |

OTHER PUBLICATIONS

Tae-Gun, Yu et al., "A 10-GHz CMOS *LC* VCO with Wide Tuning Range Using Capacitive Degeneration," Journal of Semiconductor Technology and Science, vol. 6, No. 4, Dec. 2006.
A. K. Bakkaloglu et al., "Design of a tunable multi-band differential LC VCO using 0.35 μm SiGe BiCMOS technology for multi-standard wireless communication systems," Microelectronics Journal, vol. 40, Issue 6, Jun. 2009.
W. Wong et al., "Wide Tuning Range Inversion-Mode Gated Varactor and Its Application on a 2-GHz VCO,". Digest of Technical Papers. 1999 Symposium on VLSI Circuits, 1999, pp. 53-54.
H.-M. Chen et al. "A 5.2GHz QVCO With Bottom-series Coupling and Switch Transistor Tail Current," International Electron Devices and Materials Symposium, Nov. 30-Dec. 1, 2007.

* cited by examiner

*Primary Examiner* — Arnold Kinkead
*Assistant Examiner* — Richard Tan
(74) *Attorney, Agent, or Firm* — McDermott Will & Emery LLP

(57) ABSTRACT

A semiconductor device is provided which can reduce a parasitic inductor and/or parasitic capacitance added to the wiring that couples spiral inductors and MOS varactors included in a VCO. An LC-tank VCO includes first and second spiral inductors, and first and second MOS varactors. As seen perpendicularly to the semiconductor substrate, the first and second MOS varactors are arranged in a region between the first spiral inductor and the second spiral inductor.

11 Claims, 9 Drawing Sheets

SEMICONDUCTOR DEVICE

CROSS-REFERENCE TO RELATED APPLICATIONS

The disclosure of Japanese Patent Application No. 2010-112012 filed on May 14, 2010 including the specification, drawings and abstract is incorporated herein by reference in its entirety.

BACKGROUND

The present invention relates to a semiconductor device, and more specifically to layout of the components of a voltage controlled oscillator (VCO) formed on a semiconductor substrate.

With advances in high-speed interface technologies such as PCI EXPRESS, increasing attention is being given to mounting of parts such as a VCO on an interface circuit by using inexpensive and compact complementary metal oxide semiconductor (CMOS) technology.

For example, an LC-tank VCO including CMOS transistors on a single semiconductor substrate has been proposed in "A 10-Ghz CMOS LC VCO with Wide Tuning Range Using Capacitive Degeneration", TAE-Guen Yu, Seong-IK Cho, and Hang-Geun Jeong, JOURNAL OF SEMICONDUCTOR TECHNOLOGY AND SCIENCE, VOL. 6, No. 4, December, 2006.

SUMMARY

However, according to the layout of the LC-tank VCO in "A 10-Ghz CMOS LC VCO with Wide Tuning Range Using Capacitive Degeneration", spiral inductors and MOS varactors are positioned apart from each other. A parasitic inductor and parasitic capacitance are thus added to the wiring that couples these components. As a result, the measured oscillation frequency of the VCO sometimes deviates from the theoretical estimate obtained by circuit simulation.

That is, letting L be the inductance of the spiral inductors included in the LC-tank, and C be the capacitance of the MOS varactors, the theoretical oscillation frequency f1 of the VCO is given by the following equation:

$$f1 = 1/[2 \times \pi \{L \times C\}^{1/2}]. \quad (1)$$

Further, letting Lp be the inductance of the parasitic inductor added to the wiring that couples the spiral inductors and the MOS varactors, and letting Cp be the parasitic capacitance added to the wiring, the measured oscillation frequency f2 of the VCO is given by the following equation:

$$f2 = 1/[2 \times \pi \times \{(L+Lp) \times (C+Cp)\}^{1/2}]. \quad (2)$$

Since the wiring that couples the spiral inductor and the MOS varactors has a large length in the LC-tank VCO in "A 10-Ghz CMOS LC VCO with Wide Tuning Range Using Capacitive Degeneration", the values of Lp and Cp in Equation (2) become large. As a result, the frequency f2 as given by Equation (2) deviates significantly from the theoretical frequency f1 as given by Equation (1).

Therefore, the present invention provides a semiconductor device that can reduce a parasitic inductor and/or parasitic capacitance added to the wiring that couples spiral inductors and MOS varactors included in a VCO.

A semiconductor device according to an embodiment of the present invention includes a semiconductor substrate, and an LC-tank VCO formed on the semiconductor substrate. The LC-tank VCO includes a first spiral inductor and a second spiral inductor, and a first MOS varactor and a second MOS varactor. As seen perpendicularly to the semiconductor substrate, the first MOS varactor and the second MOS varactor are arranged in the region between the first spiral inductor and the second spiral indicator.

According to an embodiment of the present invention, a parasitic inductor and/or parasitic capacitance added to the wiring that couples the spiral inductors and the MOS varactors included in the VCO can be reduced.

DETAILED DESCRIPTION

Embodiments of the present invention will be described below with reference to the drawings.

First Embodiment

Figure 1:
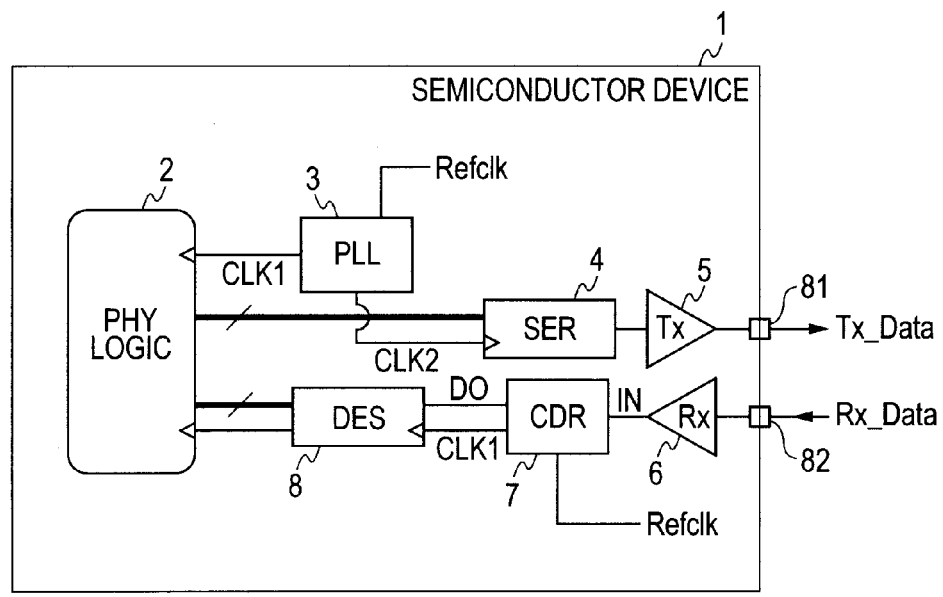
FIG. 1 illustrates the configuration of a semiconductor device according to an embodiment of the present invention.

FIG. 1 illustrates the configuration of a semiconductor device according to an embodiment of the present invention.

Referring to FIG. 1, a semiconductor device 1 is a semiconductor chip for the physical layer that converts serial data and parallel data into each other. The semiconductor device 1 includes a PHYLogic 2, a phase-locked loop (PLL) 3, a deserializer (DES) 8, a serializer (SER) 4, a clock data recovery (CDR) 7, a receive buffer 6, and a transmit buffer 5.

The receive buffer 6 outputs a serial signal IN received via an input PAD 82 coupled to a serial line, to the CDR.

The CDR 7 recovers a clock signal CLK1 and a data signal DO from the received serial signal IN.

The DES 8 outputs the clock signal CLK1 output from the CDR 7, to the PHYLogic. The DES 8 also converts the serial data signal DO output from the CDR 7 into a parallel data signal, and outputs the parallel data signal to the PHYLogic 2.

The PHYLogic 2 receives the parallel data signal from the DES 8, and outputs the parallel data signal to the upper layer. The PHYLogic 2 also outputs a parallel data signal received from the upper layer to the SER 4. The parallel data signal output by the PHYLogic 2 is synchronized with the clock signal CLK1 output from the PLL 3.

The PLL 3 outputs a clock signal CLK2 synchronized with a reference clock signal Refclk to the SER 4.

The SER 4 converts the parallel data signal output from the PHYLogic 2 into a serial data signal, in synchronism with the clock signal CLK2 output from the PLL 3.

The transmit buffer 5 receives the serial data signal output from the SER 4, and outputs the serial data signal to a serial line via an output PAD 81.

(Configuration of CDR)

Figure 2:
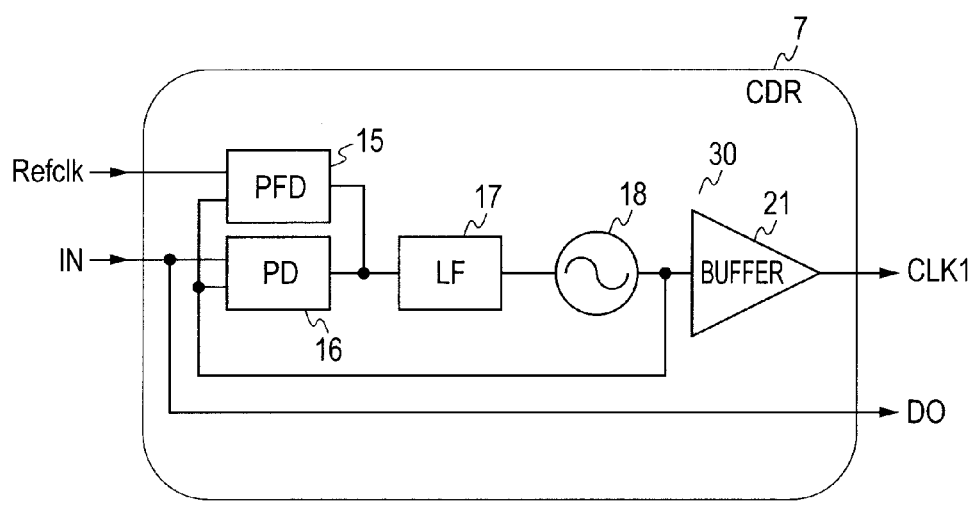
FIG. 2 illustrates the configuration of a CDR included in the semiconductor device shown in FIG. 1.

FIG. 2 illustrates the configuration of the CDR included in the semiconductor device shown in FIG. 1.

Referring to FIG. 2, the CDR 7 has a phase detector (PD) 16, a phase frequency detector (PFD) 15, a loop filter (LF) 17, a VCO 18, and an output buffer 21.

The PFD 15 compares the rising edge of the reference clock signal Refclk with the rising edge of a clock signal output from the VCO 18, and outputs a signal based on the comparison result.

The PD 16 compares the phase of the serial signal IN output from the receive buffer 6 with the phase of the clock signal output from the VCO 18, and outputs a signal according to the phase difference.

The LF 17 is a low-pass filter that smoothes the signals output from the PFD 15 and the PD 16.

The VCO 18 controls output frequency in accordance with the magnitude of a signal (voltage) output from the LF 17.

The output buffer 21 outputs a signal output from the VCO 18 to the outside.

(Configuration of PLL)

Figure 3:
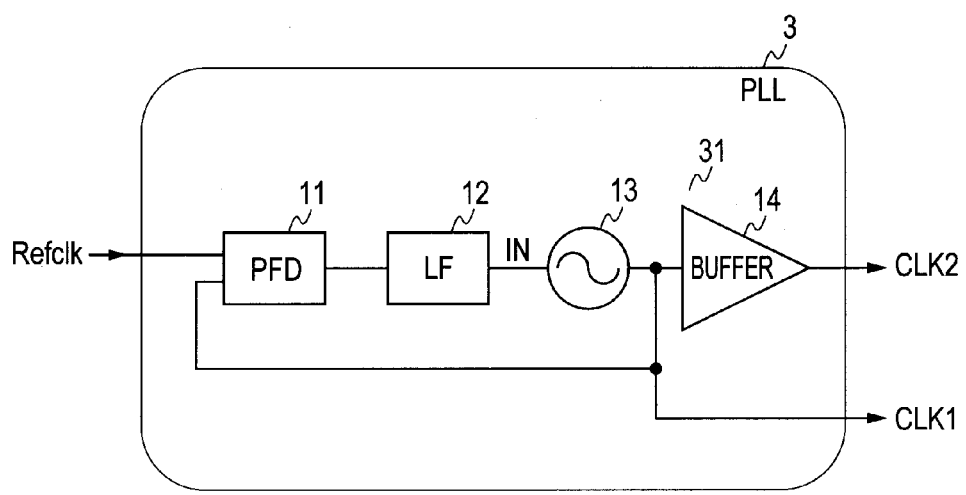
FIG. 3 illustrates the configuration of a PLL included in the semiconductor device shown in FIG. 1.

FIG. 3 illustrates the configuration of the PLL included in the semiconductor device shown in FIG. 1.

Referring to FIG. 3, the PLL 2 has a PFD 11, a LF 12, a VCO 13, and an output buffer 14.

The PFD 11 compares the phases/frequencies of two input signals, and outputs a signal based on the comparison result.

The LF 12 is a low-pass filter that smoothes the signal output from the PFD 11. The VCO 13 controls output frequency in accordance with the magnitude of a signal (voltage) output from the LF 12.

The output buffer 14 outputs a signal output from the VCO 13 to the outside.

(Configuration of VCO and Output Buffer)

Figure 4:
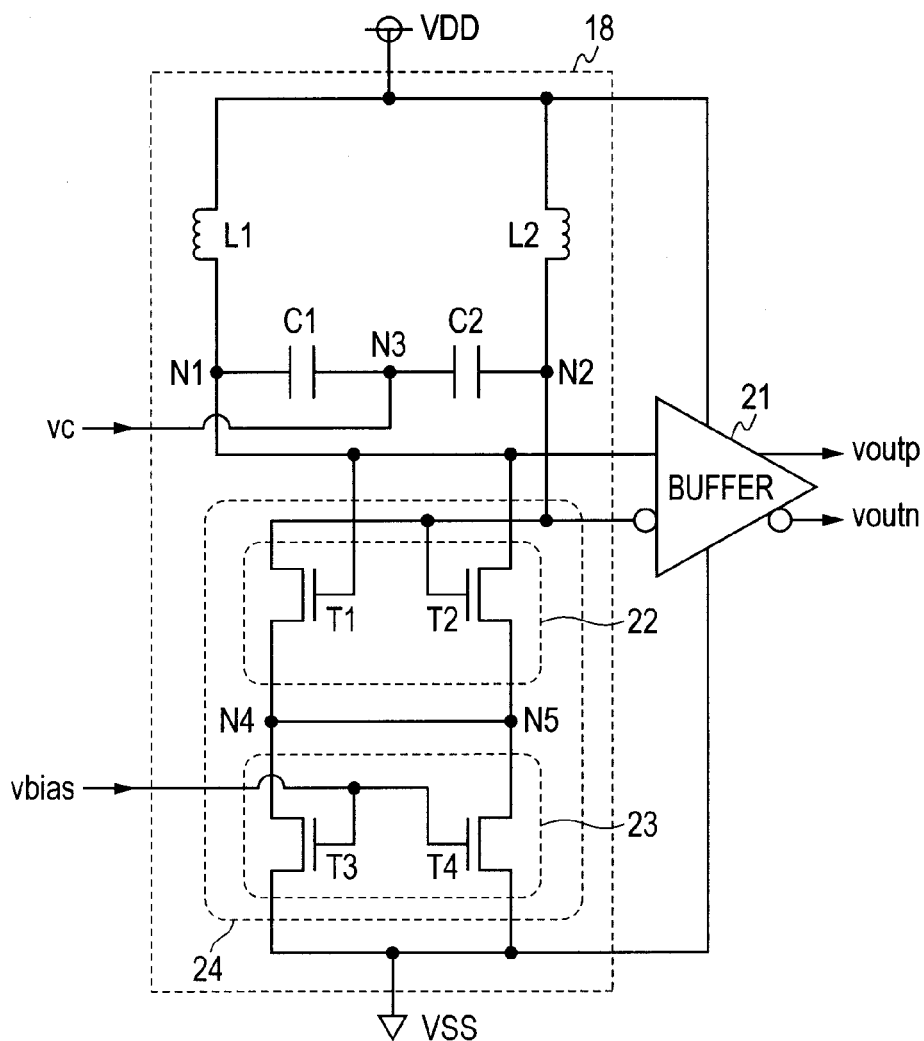
FIG. 4 illustrates the configuration of a VCO and an output buffer included in the CDR shown in FIG. 2.

FIG. 4 illustrates the configuration of the VCO and the output buffer included in the CDR shown in FIG. 2. The VCO 13 and the output buffer 14 included in the PLL 3 shown in FIG. 3 are the same as these VCO and output buffer. All of the circuit elements shown in FIG. 4 are formed on a single silicon semiconductor substrate.

The VCO shown in FIG. 4 is a CMOS VCO having an LC-parallel resonant circuit (LC-tank circuit).

This VCO includes a first MOS varactor C1, a second MOS varactor C2, a first spiral inductor L1, a second spiral inductor L2, and a stabilization circuit 24. The stabilization circuit 24 includes a differential MOS transistor pair 22, and a constant current source 23.

One end of the first spiral inductor L1 is coupled to a power supply VDD, and the other end is coupled to a node N1. One end of the second spiral inductor L2 is coupled to the power supply VDD, and the other end is coupled to a node N2. The first spiral inductor L1 and the second spiral inductor L2 are on-chip spiral inductors.

One end of the first MOS varactor C1 is coupled to the node N1, and the other end is coupled to a node N3. One end of the second MOS varactor C2 is coupled to the node N2, and the other end is coupled to the node N3. The node N3 receives a control voltage vc (the input signal IN shown in FIG. 3) for setting the capacitance of each of the first MOS varactor C1 and the second MOS varactor C2.

The differential MOS transistor pair 22 includes a first N-channel MOS transistor T1, and a second N-channel MOS transistor T2. The differential MOS transistor pair 22 is provided in order to maintain oscillation.

The first N-channel MOS transistor T1 has a gate coupled to the node N1, a drain coupled to the node N2, and a source coupled to a node N4. The second N-channel MOS transistor T2 has a gate coupled to the node N2, a drain coupled to the node N1, and a source coupled to a node N5.

The constant current source 23 includes a third N-channel MOS transistor T3, and a fourth N-channel MOS transistor T4. The third N-channel MOS transistor T3 has a gate that receives a bias voltage vbias, a drain coupled to the node N4, and a source coupled to the ground. The fourth N-channel MOS transistor T4 has a gate that receives the bias voltage vbias, a drain coupled to the node N5, and a source coupled to the ground.

The output buffer 21 receives the voltages at the node N1 and the node N2, and outputs a first output signal voutp and a second output signal voutn. The output buffer 21 is configured by, for example, a CMOS inverter or a differential amplifier.

(Layout)

Figure 5:
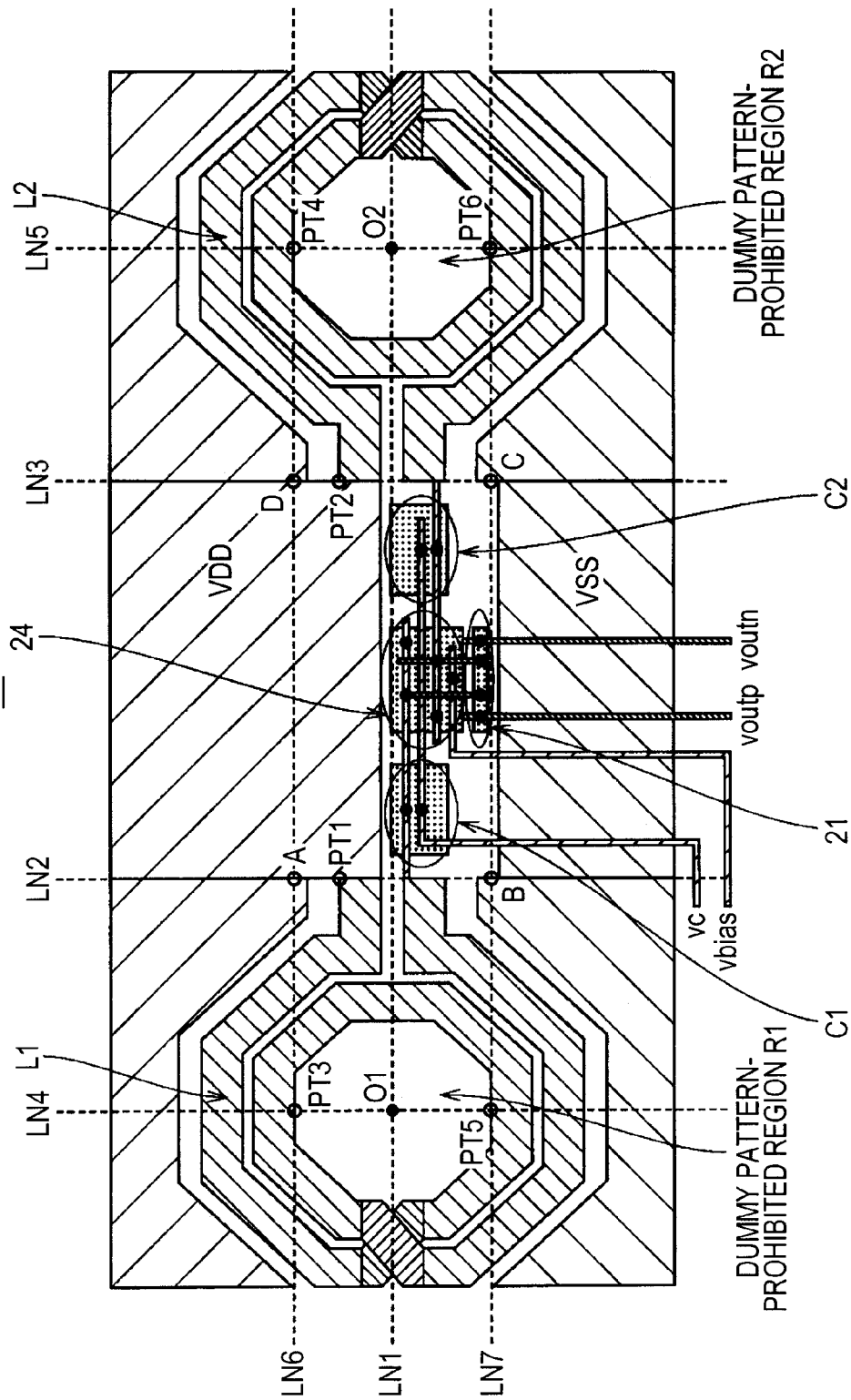
FIG. 5 is a view, as seen perpendicularly to a semiconductor substrate, of the VCO and the output buffer according to a first embodiment.

FIG. 5 is a view, as seen perpendicularly to the semiconductor substrate, of the VCO and the output buffer according to the first embodiment.

Referring to FIG. 5, as seen perpendicularly to the semiconductor substrate, the first MOS varactor C1, the second MOS varactor C2, the stabilization circuit 24, and the output buffer 21 are arranged within a region bounded by a straight line LN2, a straight line LN3, a straight line LN6, and a straight line LN7, that is, a square region whose vertices are a point A, a point B, a point C, and a point D.

The straight line LN2 is a straight line that is perpendicular to a straight line LN1 coupling the center O1 of the first spiral inductor L1 and the center of the second spiral inductor L2, and passes through a point PT1 on the first spiral inductor L1 which is nearest to the second spiral inductor L2.

The straight line LN3 is a straight line that is perpendicular to the straight line LN1 coupling the center O1 of the first spiral inductor L1 and the center O2 of the second spiral inductor L2, and passes through a point PT2 on the second spiral inductor L2 which is nearest to the first spiral inductor L1.

The straight line LN6 is a straight line that couples a point PT3 and a point PT4. The point PT3 is one point on the edge of the inner circle of the first spiral inductor L1 which intersects a straight line LN4, which is perpendicular to the straight line LN1 coupling the center O1 of the first spiral inductor L1 and the center O2 of the second spiral inductor L2 and passes through the center O1 of the first spiral inductor L1. The point PT4 is one point on the edge of the inner circle of the second spiral inductor L2 which intersects a straight line LN5, which is perpendicular to the straight line LN1 coupling the center O1 of the first spiral inductor L1 and the center O2 of the second spiral inductor L2 and passes through the center O2 of the second spiral inductor L2.

The straight line LN7 is a straight line that couples a point PT5 and a point PT6. The point PT5 is the other point on the edge of the inner circle of the first spiral inductor L1 which intersects the straight line LN4, which is perpendicular to the straight line LN1 coupling the center O1 of the first spiral inductor L1 and the center O2 of the second spiral inductor L2 and passes through the center O1 of the first spiral inductor L1. The point PT6 is the other point on the edge of the inner circle of the second spiral inductor L2 which intersects the straight line LN5, which is perpendicular to the straight line LN1 coupling the center O1 of the first spiral inductor L1 and the center O2 of the second spiral inductor L2 and passes through the center O2 of the second spiral inductor L2.

The power supply line VDD and a ground power supply line VSS are arranged above and below the first spiral inductor L1, the second spiral inductor L2, the first MOS varactor C1, the second MOS varactor C2, the stabilization circuit 24, and the output buffer 21.

The region bounded by the inner circle of the first spiral inductor L1 is a dummy pattern-prohibited region R1. The region bounded by the inner circle of the second spiral inductor L2 is a dummy pattern-prohibited region R2. No dummy pattern is generated in these regions. This is to prevent parasitic components from being added. While the shape of the spiral inductors has been described as being a circle for the sake of explanation, the shape of the spiral inductors may be a planar square shape or a polygonal shape. In the case of such a planar square shape or polygonal shape as well, the points PT3 to PT6 are points on the edge of the shape.

(Layout (Enlarged))

Figure 6:
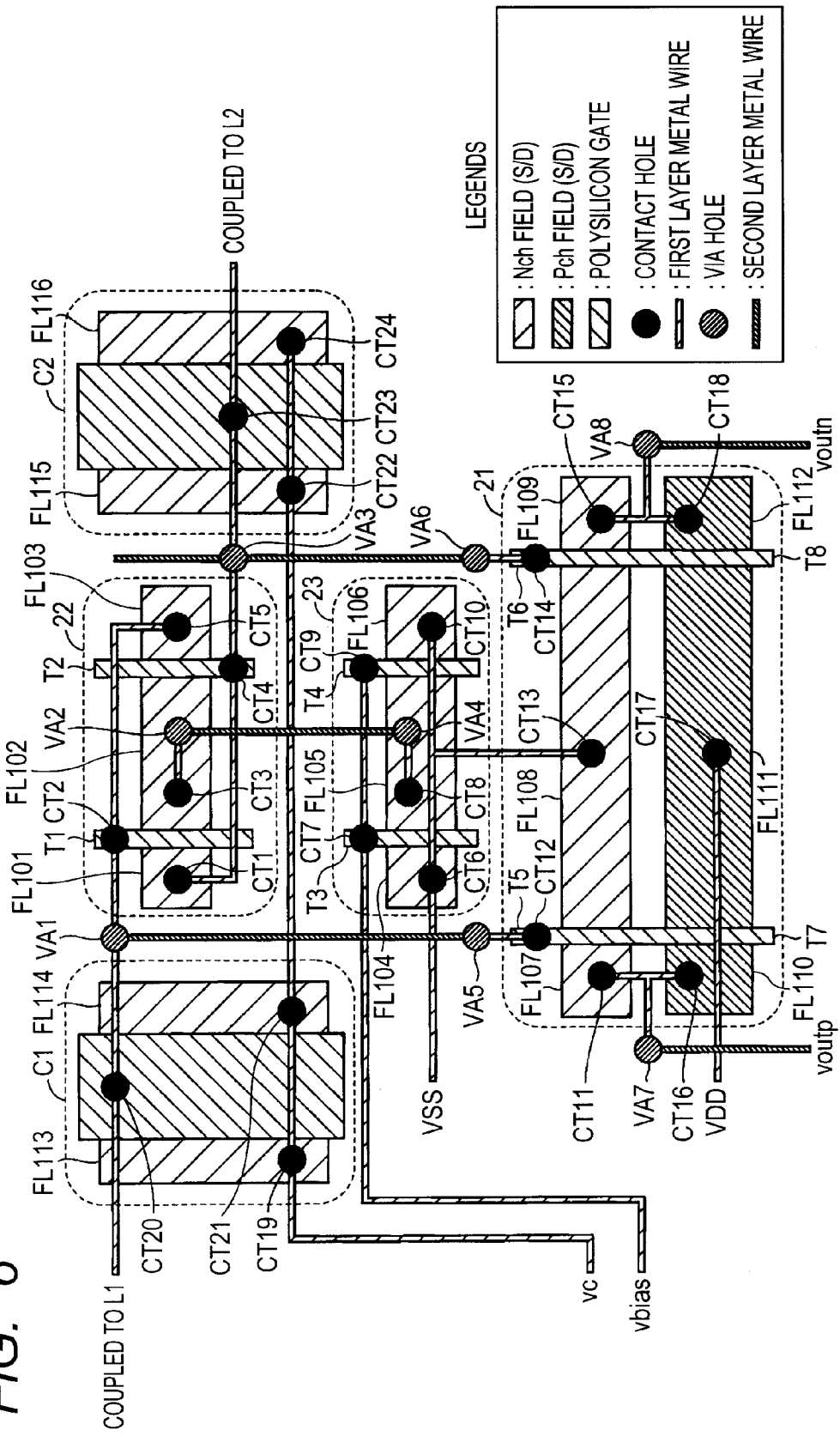
FIG. 6 is an enlarged view of the arrangement and wiring of first and second MOS varactors and output buffer shown in FIG. 5.

FIG. 6 is an enlarged view of the arrangement and wiring of the first and second MOS varactors and output buffer shown in FIG. 5.

In FIG. 6, two CMOS inverters are used as the output buffer 21. Referring to FIG. 6, N-channel MOS transistors T1 to T6, and the MOS varactors C1 and C2 are arranged within a P-well (not shown). P-channel MOS transistors T7 and T8 are arranged within an N-well (not shown).

The first MOS varactor C1 has a pair of N-type diffusion regions FL113 and FL114, and a gate formed of polysilicon that is arranged between these regions. The second MOS varactor C2 has a pair of N-type diffusion regions FL115 and FL116, and a gate formed of polysilicon that is arranged between these regions. The N-type diffusion region FL113, the N-type diffusion region FL114, the N-type diffusion region FL116, and the N-type diffusion region FL115 are coupled to each other via a contact hole CT19, a contact hole CT21, a contact hole CT24, a contact hole CT22, and a first layer metal wire, and receive a control voltage vc.

The first N-channel MOS transistor T1 has a pair of N-type diffusion regions FL101 (drain) and FL102 (source), and a gate formed of polysilicon that is arranged between these regions. The second N-channel MOS transistor T2 has a pair of N-type diffusion regions FL103 (drain) and FL102 (source), and a gate formed of polysilicon that is arranged between these regions.

The third N-channel MOS transistor T3 has a pair of N-type diffusion regions FL104 (drain) and FL105 (source), and a gate formed of polysilicon that is arranged between these regions. The fourth N-channel MOS transistor T4 has a pair of N-type diffusion regions FL106 (drain) and FL105 (source), and a gate formed of polysilicon that is arranged between these regions.

The fifth N-channel MOS transistor T5 has a pair of N-type diffusion regions FL107 (drain) and FL108 (source), and a gate formed of polysilicon that is arranged between these regions. The sixth N-channel MOS transistor T6 has a pair of N-type diffusion regions FL109 (drain) and FL108 (source), and a gate formed of polysilicon that is arranged between these regions. The first P-channel MOS transistor T7 has a pair of P-type diffusion regions FL110 (drain) and FL111 (source), and a gate formed of polysilicon that is arranged between these regions. The second P-channel MOS transistor T8 has a pair of P-type diffusion regions FL112 (drain) and FL111 (source), and a gate formed of polysilicon that is arranged between these regions.

The fifth N-channel MOS transistor T5 and the first P-channel MOS transistor T7 form a CMOS inverter. The sixth N-channel MOS transistor T6 and the second P-channel MOS transistor T8 form a CMOS inverter.

The P-type diffusion region FL111 is coupled to the power supply VDD through a contact hole CT17 and the first layer metal wire. The N-type diffusion region FL108 is coupled to the ground power supply VSS through a contact hole CT13 and the first layer metal wire. The N-type diffusion region FL104 is coupled to the ground power supply VSS through a contact hole CT6 and the first layer metal wire. The N-type diffusion region FL106 is coupled to the ground power supply VSS through a contact hole CT10 and the first layer metal wire.

The P-type diffusion region FL110 is coupled to a via hole VA7 through a contact hole CT16 and the first layer metal wire. The N-type diffusion region FL107 is coupled to the via hole VA7 through a contact hole CT11 and the first layer metal wire. The via hole VA7 outputs the output signal voutp through a second layer metal wire. The P-type diffusion region FL112 is coupled to a via hole VA8 through a contact hole CT18 and the first layer metal wire. The N-type diffusion region FL109 is coupled to the via hole VA8 through a contact hole CT15 and the first layer metal wire. The via hole VA8 outputs the output signal voutn through the second layer metal wire.

The polysilicon gate of the third N-channel MOS transistor T3 receives the bias voltage vbias through a contact hole CT7 and the first layer metal wire. The polysilicon gate of the fourth N-channel MOS transistor T4 receives the bias voltage vbias through a contact hole CT9 and the first layer metal wire.

The N-type diffusion region FL102 is coupled to the N-type diffusion region FL105 via a contact hole CT3, the first layer metal wire, a via hole VA2, the second layer metal wire, a via hole VA4, and a contact hole CT8.

The polysilicon gate of the first varactor C1, the polysilicon gate of the first N-channel MOS transistor T1, the N-type diffusion region FL103, the polysilicon gate of the fifth N-channel MOS transistor T5, and the polysilicon gate of the first P-channel MOS transistor T7 are coupled to each other via a contact hole CT20, a contact hole CT2, a contact hole CT5, a via hole VA1, a via hole VA5, a contact hole CT12, the first layer metal wire, and the second layer metal wire, and are coupled to the first spiral inductor L1.

The polysilicon gate of the second varactor C2, the polysilicon gate of the second N-channel MOS transistor T2, the N-type diffusion region FL101, the polysilicon gate of the sixth N-channel MOS transistor T6, and the polysilicon gate of the second P-channel MOS transistor T8 are coupled to each other via a contact hole CT23, a contact hole CT4, a contact hole CT1, a via hole VA3, a via hole VA6, a contact hole CT14, the first layer metal wire, and the second layer metal wire, and are coupled to the second spiral inductor L2.

(Layout (Bumps))

The semiconductor device according to an embodiment of the present invention has a structure called wafer process package (WPP). In the WPP structure, from an Al pad electrode in the vicinity of a semiconductor chip, rewiring is performed on the chip using Cu or the like, the electrode is extended over the entire chip area, and solder bumps are formed on this electrode.

Figure 7:
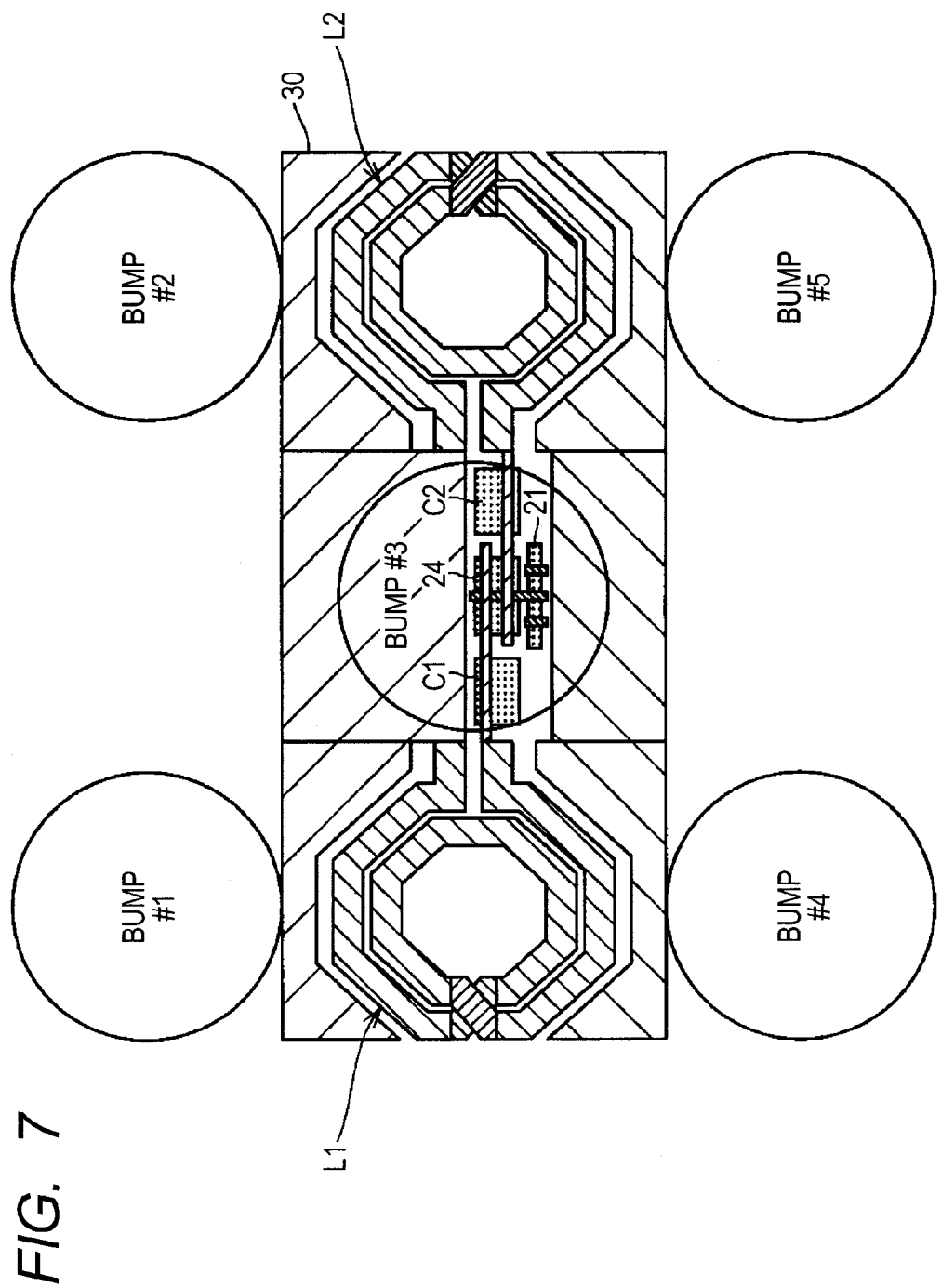
FIG. 7 illustrates the arrangement of bumps in the semiconductor device according to an embodiment of the present invention.

FIG. 7 illustrates the arrangement of bumps in the semiconductor device according to an embodiment of the present invention. Referring to FIG. 7, a plurality of bumps are arranged in a staggered fashion on the main surface (front surface) of a semiconductor chip.

As seen perpendicularly to the semiconductor substrate, bumps #1 to #4 are arranged in a region that does not overlap the first spiral inductor L1 and the second spiral inductor L2. This makes it possible to prevent parasitic components from being added.

As described above, in the semiconductor device according to the first embodiment of the present invention, as seen perpendicularly to the semiconductor substrate, the first MOS varactor C1, the second MOS varactor C2, the stabilization circuit 24, and the output buffer 21 are arranged in the region bounded by the straight line LN2, the straight line LN3, the straight line LN6, and the straight line LN7. Thus, the length of the wiring that couples the spiral inductors L1 and L2, the MOS varactors C1 and C2, the stabilization circuit 24, and the output buffer 21 is shorter than that in the related art, thereby making it possible to reduce a parasitic inductor and/or parasitic capacitance added to the wiring that couples these components.

Modification of First Embodiment

Figure 8:
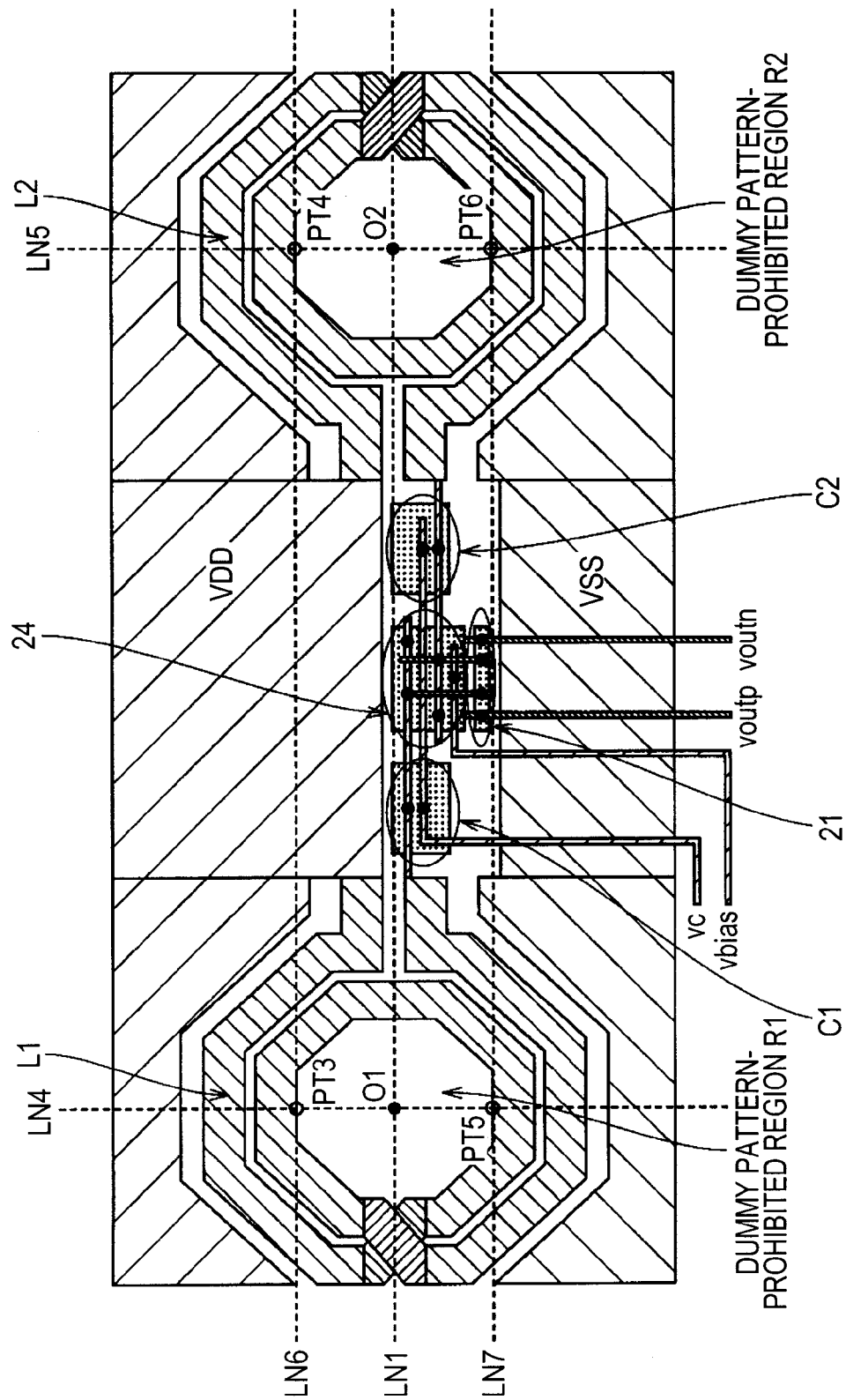
FIG. 8 is a view, as seen perpendicularly to the semiconductor substrate, of the VCO and the output buffer according to a modification of the first embodiment.

FIG. 8 is a view, as seen perpendicularly to the semiconductor substrate, of the VCO and the output buffer according to a modification of the first embodiment.

Referring to FIG. 8, as seen perpendicularly to the semiconductor substrate, the first MOS varactor C1, the second MOS varactor C2, the stabilization circuit 24, and the output buffer 21 may be arranged in a region that lies between the straight line LN6 and the straight line LN7, and between the first spiral inductor L1 and the second spiral inductor (which may not necessarily be a square depending on the shape of the first and second spiral inductors).

As described above, in the semiconductor device according to the modification of the first embodiment of the present invention, as seen perpendicularly to the semiconductor substrate, the first MOS varactor C1, the second MOS varactor C2, the stabilization circuit 24, and the output buffer 21 are arranged in the region that lies between the straight line LN6 and the straight line LN7, and between the first spiral inductor L1 and the second spiral inductor. Thus, the length of the wiring that couples the spiral inductors L1 and L2, the MOS varactors C1 and C2, the stabilization circuit 24, and the output buffer 21 is shorter than that in the related art, thereby making it possible to reduce a parasitic inductor and/or parasitic capacitance added to the wiring that couples these components.

Second Embodiment

Figure 9:
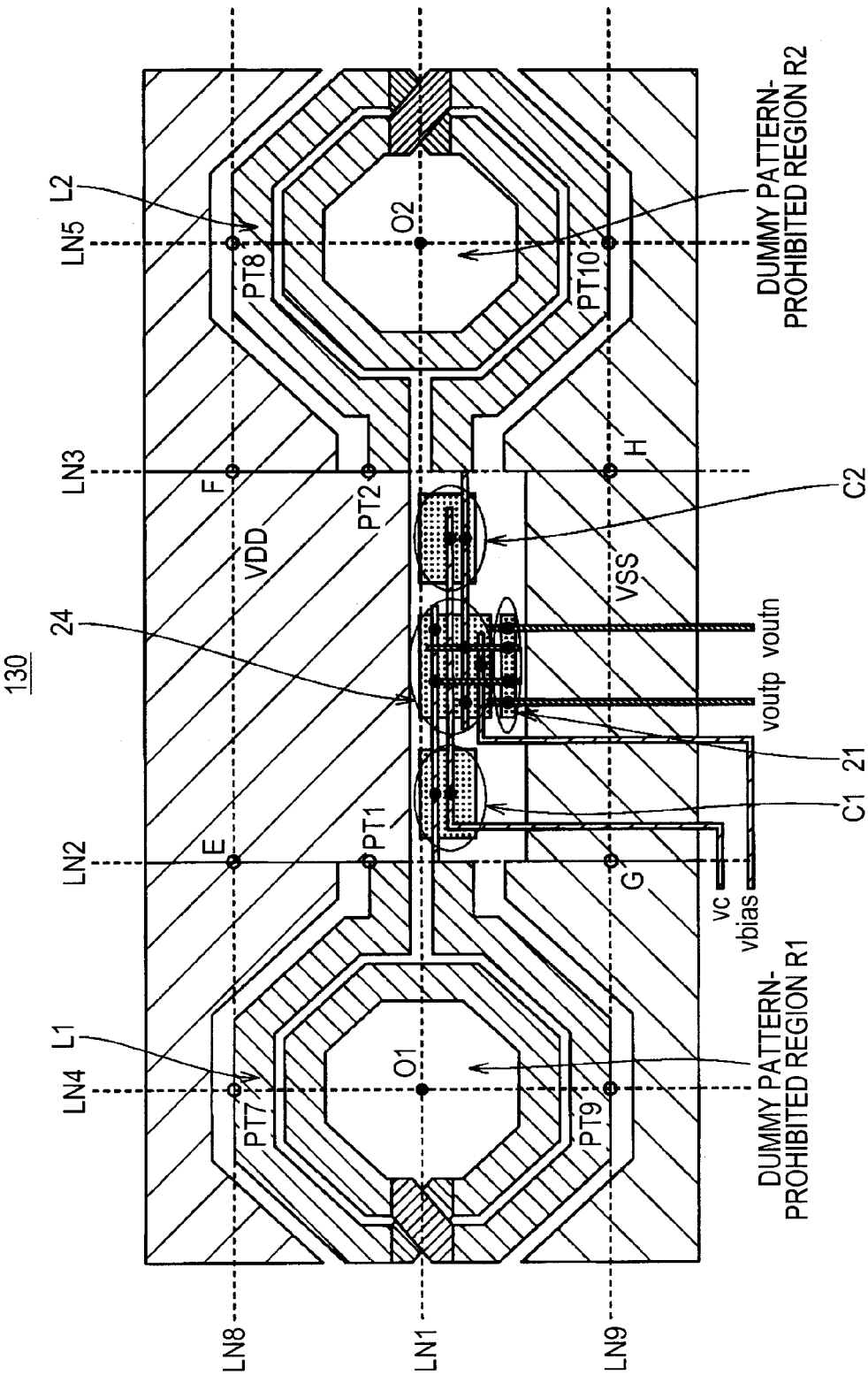
FIG. 9 is a view, as seen perpendicularly to the semiconductor substrate, of the VCO and the output buffer according to a second embodiment.

FIG. 9 is a view, as seen perpendicularly to the semiconductor substrate, of the VCO and the output buffer according to a second embodiment.

Referring to FIG. 9, as seen perpendicularly to the semiconductor substrate, the first MOS varactor C1, the second MOS varactor C2, the stabilization circuit 24, and the output buffer 21 are arranged within a region bounded by the straight line LN2, the straight line LN3, a straight line LN8, and a straight line LN9, that is, a square region whose vertices are a point E, a point F, a point G, and a point H.

The straight line LN2 is a straight line that is perpendicular to the straight line LN1 coupling the center O1 of the first spiral inductor L1 and the center of the second spiral inductor L2, and passes through the point PT1 on the first spiral inductor L1 which is nearest to the second spiral inductor L2.

The straight line LN3 is a straight line that is perpendicular to the straight line LN1 coupling the center O1 of the first spiral inductor L1 and the center O2 of the second spiral inductor L2, and passes through the point PT2 on the second spiral inductor L2 which is nearest to the first spiral inductor L1.

The straight line LN8 is a straight line that couples a point PT7 and a point PT8. The point PT7 is one point on the edge of the outer circle of the first spiral inductor L1 which intersects the straight line LN4, which is perpendicular to the straight line LN1 coupling the center O1 of the first spiral inductor L1 and the center O2 of the second spiral inductor L2 and passes through the center O1 of the first spiral inductor L1. The point PT7 is one point on the edge of the outer circle of the second spiral inductor L2 which intersects the straight line LN5, which is perpendicular to the straight line LN1 coupling the center O1 of the first spiral inductor L1 and the center O2 of the second spiral inductor L2 and passes through the center O2 of the second spiral inductor L2.

The straight line LN9 is a straight line that couples a point PT9 and a point PT10. The point PT9 is the other point on the edge of the outer circle of the first spiral inductor L1 which intersects the straight line LN4, which is perpendicular to the straight line LN1 coupling the center O1 of the first spiral inductor L1 and the center O2 of the second spiral inductor L2 and passes through the center O1 of the first spiral inductor L1. The point PT10 is the other point on the edge of the outer circle of the second spiral inductor L2 which intersects the straight line LN5, which is perpendicular to the straight line LN1 coupling the center O1 of the first spiral inductor L1 and the center O2 of the second spiral inductor L2 and passes through the center O2 of the second spiral inductor L2.

As described above, in the semiconductor device according to the second embodiment of the present invention, as seen perpendicularly to the semiconductor substrate, the first MOS varactor C1, the second MOS varactor C2, the stabilization circuit 24, and the output buffer 21 are arranged in the region bounded by the straight line LN2, the straight line LN3, the straight line LN8, and the straight line LN9. Thus, the length of the wiring that couples the spiral inductors L1 and L2, the MOS varactors C1 and C2, the stabilization circuit 24, and the output buffer 21 is shorter than that in the related art, thereby making it possible to reduce a parasitic inductor and/or parasitic capacitance added to the wiring that couples these components.

Modification of Second Embodiment

Figure 10:
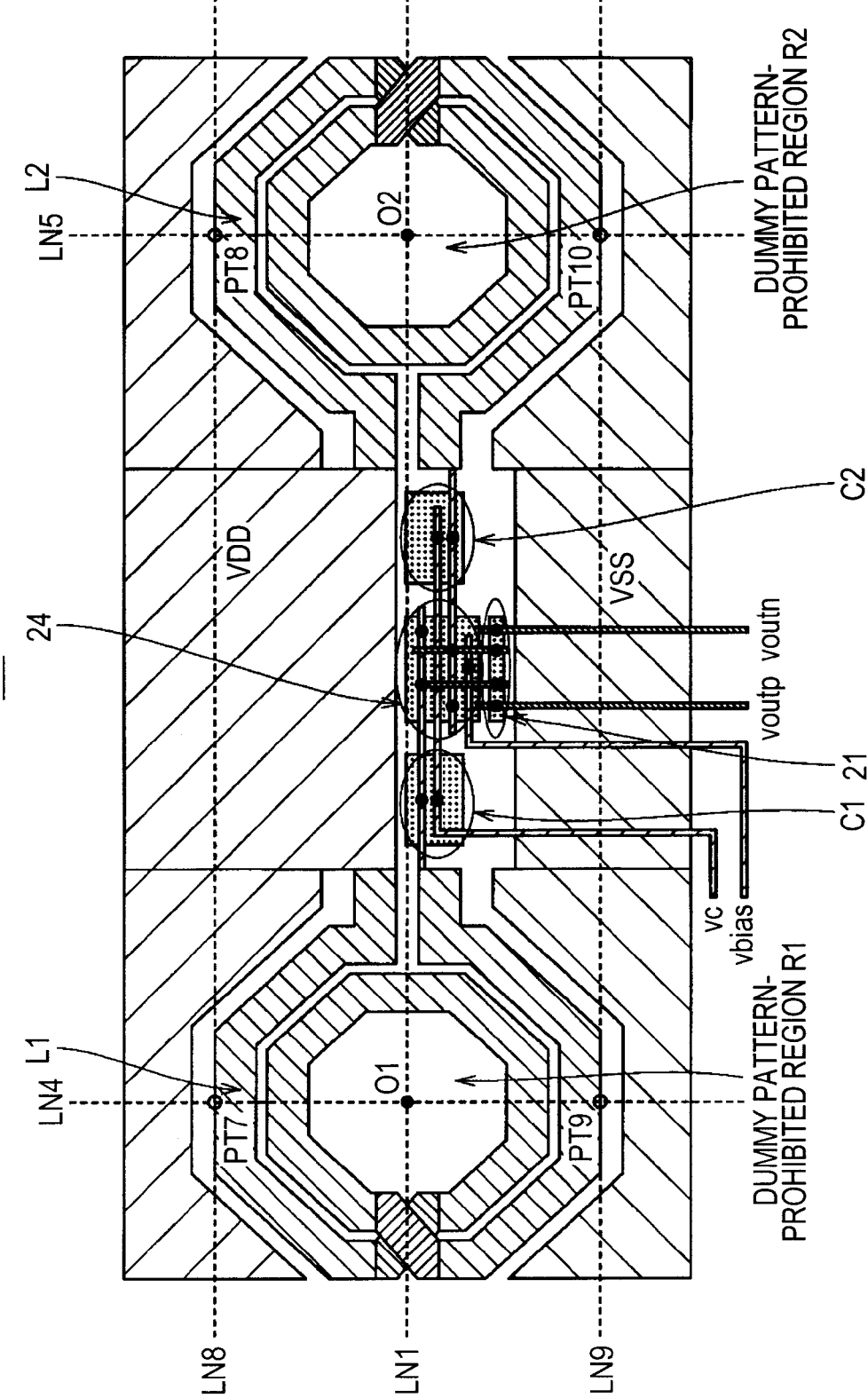
FIG. 10 is a view, as seen perpendicularly to the semiconductor substrate, of the VCO and the output buffer according to a modification of the second embodiment.

FIG. 10 is a view, as seen perpendicularly to the semiconductor substrate, of the VCO and the output buffer according to a modification of the second embodiment.

Referring to FIG. 10, as seen perpendicularly to the semiconductor substrate, the first MOS varactor C1, the second MOS varactor C2, the stabilization circuit 24, and the output buffer 21 may be arranged in a region that lies between the straight line LN8 and the straight line LN9, and between the first spiral inductor L1 and the second spiral inductor. This region includes, for example, a point that is nearer to the first spiral inductor L1 than the point E shown in FIG. 9.

As described above, in the semiconductor device according to the modification of the second embodiment of the present invention, as seen perpendicularly to the semiconductor substrate, the first MOS varactor C1, the second MOS varactor C2, the stabilization circuit 24, and the output buffer 21 are arranged in the region that lies between the straight line LN8 and the straight line LN9, and between the first spiral inductor L1 and the second spiral inductor. Thus, the length of the wiring that couples the spiral inductors L1 and L2, the MOS varactors C1 and C2, the stabilization circuit 24, and the output buffer 21 is shorter than that in the related art, thereby making it possible to reduce a parasitic inductor and/or parasitic capacitance added to the wiring that couples these components.

The present invention is not limited to the above-mentioned embodiments but includes the following modifications, for example.

While in the above embodiments of the present invention the differential MOS transistor pair and the constant current source are configured by N-channel MOS transistors, the present invention is not limited to this. The differential MOS transistor pair and the constant current source may be configured by P-channel MOS transistors.

While the constant current source is configured by two MOS transistors, the constant current source may be configured by a single MOS transistor.

The embodiments disclosed herein are merely illustrative in all respects and should not be construed restrictively. The scope of the present invention is to be defined not by the above description but by the appended claims, and is intended to cover all such equivalents and changes that fall within the scope of the appended claims.

What is claimed is:

1. A semiconductor device comprising:
    a semiconductor substrate; and
    an LC-tank VCO formed over the semiconductor substrate,
    wherein the LC-tank VCO includes:
    a first spiral inductor coupled to a first node;
    a second spiral inductor coupled to a second node; and
    a first MOS varactor coupled to the first node;
    a second MOS varactor coupled to the second node;
    a first MOS transistor having a drain coupled to the first node and a gate coupled to the second node; and
    a second MOS transistor having a drain coupled to the second node and a gate coupled to the first node,
    wherein as seen perpendicularly to the semiconductor substrate, the first MOS varactor and the second MOS varactor are arranged between the first spiral inductor and the second spiral inductor, and the first and second MOS transistors are arranged between the first and second MOS varactors,
    wherein, as seen perpendicularly to the semiconductor substrate, the first MOS varactor and the second MOS varactor are arranged at a position within a zone sandwiched between a first straight line and a second straight line,
    wherein the first straight line is a straight line coupling one point on an outer edge of the first spiral inductor which intersects a straight line that is perpendicular to a straight line coupling a center of the first spiral inductor, and a center of the second spiral inductor and passes through the center of the first spiral inductor, and one point on an outer edge of the second spiral inductor which intersects a straight line that is perpendicular to the straight line coupling the center of the first spiral inductor and the center of the second spiral inductor and passes through the center of the second spiral inductor, and
    wherein the second straight line is a straight line coupling the other point on the outer edge of the first spiral inductor which intersects the straight line that is perpendicular to the straight line coupling the center of the first spiral inductor and the center of the second spiral inductor and passes through the center of the first spiral inductor, and the other point on the outer edge of the second spiral inductor which intersects the straight line that is perpendicular to the straight line coupling the center of the first spiral inductor and the center of the second spiral inductor and passes through the center of the second spiral inductor.

2. The semiconductor device according to claim 1, wherein a region bounded by an inner edge of each of the first spiral inductor and the second spiral inductor docs not include a dummy pattern.

3. The semiconductor device according to claim 1, further comprising:
    a plurality of bumps arranged over a main surface of the semiconductor substrate,
    wherein, as seen perpendicularly to the semiconductor substrate, the bumps are arranged in a region that does not overlap the first spiral inductor and the second spiral inductor.

4. The semiconductor device according to claim 1, further comprising:
    an output buffer that is formed over the semiconductor substrate, and has a first input terminal coupled to the first node and a second input terminal coupled to the second node,
    wherein, as seen perpendicularly to the semiconductor substrate, the output buffer is arranged between the first spiral inductor and the second spiral inductor.

5. The semiconductor device according to claim 4,
    wherein the LC-tank VCO further includes:
    a constant current source coupled to the first and second nodes;
    wherein, as seen perpendicularly to the semiconductor substrate, the constant current source is arranged between the first spiral inductor and the second spiral inductor.

6. A semiconductor device comprising:
    a semiconductor substrate; and
    an LC-tank VCO formed over the semiconductor, substrate,
    wherein the LC-tank VCO includes:
    a first spiral inductor coupled to a first node;
    a second spiral inductor coupled to a second node; and
    a first MOS varactor coupled to the first node;
    a second MOS varactor coupled to the second node;
    a first MOS transistor having a drain coupled to the first node and a gate coupled to the second node; and
    a second MOS transistor having a drain coupled to the second node and a gate coupled to the first node,
    wherein as seen perpendicularly to the semiconductor substrate, the first MOS varactor and the second MOS varactor are arranged between the first spiral inductor and the second spiral inductor, and the first and second MOS transistors are arranged between the first and second MOS varactors,
    wherein, as seen perpendicularly to the semiconductor substrate, the first MOS varactor, the second MOS varactor, the first MOS transistor and the second MOS transistor are arranged at a position within a zone sandwiched between a first straight line and a second straight line,
    wherein the first straight line is a straight line coupling one point on an inner edge of the first spiral inductor which intersects a straight line that is perpendicular to a straight line coupling a center of the first spiral inductor and a center of the second spiral inductor and passes through the center of the first spiral inductor, and one point on an inner edge of the second spiral inductor which intersects a straight line that is perpendicular to the straight line coupling the center of the first spiral inductor and the center of the second spiral inductor and passes through the center of the second spiral inductor, and wherein the second straight line is a straight line coupling the other point on the inner edge of the first spiral inductor which intersects the straight line that is perpendicular to the straight line coupling the center of the first spiral inductor and the center of the second spiral inductor and passes through the center of the first spiral inductor, and the other point on the inner edge of the second spiral inductor which intersects the straight line that is perpendicular to the straight line coupling the center of the first spiral inductor and the center of the second spiral inductor and passes through the center of the second spiral inductor.

7. A semiconductor device comprising:
a semiconductor substrate; and
an LC-tank VCO formed over the semiconductor substrate, wherein the LC-tank VCO includes:
a first spiral inductor coupled to a first node;
a second spiral inductor coupled to a second node; and
a first MOS varactor coupled to the first node;
a second MOS varactor coupled to the second node;
a first MOS transistor having a drain coupled to the first node and a gate coupled to the second node; and
a second MOS transistor having a drain coupled to the second node and a gate coupled to the first node,
wherein as seen perpendicularly to the semiconductor substrate, the first MOS varactor and the second MOS varactor are arranged between the first spiral inductor and the second spiral inductor, and the first and second MOS transistors are arranged between the first and second MOS varactors,
wherein as seen perpendicularly to the semiconductor substrate, the first MOS varactor, the second MOS varactor, the first MOS transistor and the second MOS transistor are arranged at a position within a zone bounded by a first straight line, a second straight line, a third straight line, and a fourth straight line,
wherein the first straight line is a straight line that is perpendicular to a straight line coupling a center of the first spiral inductor and a center of the second spiral inductor, and passes through a point on the first spiral inductor which is nearest to the second spiral inductor,
wherein the second straight line is a straight line that is perpendicular to the straight line coupling the center of the first spiral inductor and the center of the second spiral inductor, and passes through a point on the second spiral inductor which is nearest to the first spiral inductor,
wherein the third straight line is a straight line coupling one point on an outer edge of the first spiral inductor which intersects a straight line that is perpendicular to the straight line coupling the center of the first spiral inductor and the center of the second spiral inductor and passes through the center of the first spiral inductor, and one point on an outer edge of the second spiral inductor which intersects a straight line that is perpendicular to the straight line coupling the center of the first spiral inductor and the center of the second spiral inductor and passes through the center of the second spiral inductor, and
wherein the fourth straight line is a straight line coupling the other point on the outer edge of the first spiral inductor which intersects the straight line that is perpendicular to the straight line coupling the center of the first spiral inductor and the center of the second spiral inductor and passes through the center of the first spiral inductor, and the other point on the outer edge of the second spiral inductor which intersects the straight line that is perpendicular to the straight line coupling the center of the first spiral inductor and the center of the second spiral inductor and passes through the center of the second spiral inductor.

8. A semiconductor device comprising:
a semiconductor substrate; and
an LC-tank VCO formed over the semiconductor substrate, wherein the LC-tank VCO includes:
a first spiral inductor coupled to a first node;
a second spiral inductor coupled to a second node; and
a first MOS varactor coupled to the first node;
a second MOS varactor coupled to the second node;
a first MOS transistor having a drain coupled to the first node and a gate coupled to the second node; and
a second MOS transistor having a drain coupled to the second node and a gate coupled to the first node,
wherein as seen perpendicularly to the semiconductor substrate, the first MOS varactor and the second MOS varactor are arranged between the first spiral inductor and the second spiral inductor, and the first and second MOS transistors are arranged between the first and second MOS varactors,
wherein, as seen perpendicularly to the semiconductor substrate, the first MOS varactor, the second MOS varactor, the first MOS transistor and the second MOS transistor are arranged at a position within a zone bounded by a first straight line, a second straight line, a third straight line, and a fourth straight line,
wherein the first straight line is a straight line that is perpendicular to a straight line coupling a center of the first spiral inductor and a center of the second spiral inductor, and passes through a point on the first spiral inductor which is nearest to the second spiral inductor,
wherein the second straight line is a straight line that is perpendicular to the straight line coupling the center of the first spiral inductor and the center of the second spiral inductor, and passes through a point on the second spiral inductor which is nearest to the first spiral inductor,
wherein the third straight line is a straight line coupling one point on an inner edge of the first spiral inductor which intersects a straight line that is perpendicular to the straight line coupling the center of the first spiral inductor and the center of the second spiral inductor and passes through the center of the first spiral inductor, and one point on an inner edge of the second spiral inductor which intersects a straight line that is perpendicular to the straight line coupling the center of the first spiral inductor and the center of the second spiral inductor and passes through the center of the second spiral inductor, and
wherein the fourth straight line is a straight line coupling the other point on the inner edge of the first spiral inductor which intersects the straight line that is perpendicular to the straight line coupling the center of the first spiral inductor and the center of the second spiral inductor and passes through the center of the first spiral inductor, and the other point on the inner edge of the second spiral inductor, which intersects the straight line that is perpendicular to the straight line coupling the center of the first spiral inductor and the center of the second spiral inductor and passes through the center of the second spiral inductor.

9. A semiconductor device comprising:
a semiconductor substrate; and
an LC-tank VCO formed over the semiconductor substrate, wherein the LC-tank VCO includes:

a first spiral inductor coupled to a first node;
a second spiral inductor coupled to a second node; and
a first MOS varactor coupled to the first node;
a second MOS varactor coupled to the second node;
a first MOS transistor having a drain coupled to the first node and a gate coupled to the second node; and
a second MOS transistor having a drain coupled to the second node and a gate coupled to the first node,
wherein as seen perpendicularly to the semiconductor substrate, the first MOS varactor and the second MOS varactor are arranged between the first spiral inductor and the second spiral inductor, and the first and second MOS transistors are arranged between the first and second MOS varactors,
wherein the first and second inductors are arranged in a first direction, and the first and second MOS varactors are arranged in the first direction,
wherein the first and second MOS transistors are arranged in the first direction, and
the semiconductor device, further comprising:
a first wiring extending in the first direction and coupled to the first inductor, the first MOS varactor, the drain of the first MOS transistor and the gate of the second MOS transistor, and
a second wiring extending in the first direction and coupled to the second inductor, the second MOS varactor, the drain of the second MOS transistor and the gate of the first MOS transistor.

10. The semiconductor device according to claim 9, wherein the first and second wirings have respective parts arranged in parallel to each other.

11. The second conductor device according to claim 9, further comprising
a third wiring coupled between the first and second MOS varactors and having a part arranged in parallel with the first and second wirings.

* * * * *